(12) United States Patent
Fujihara et al.

(10) Patent No.: US 7,416,676 B2
(45) Date of Patent: Aug. 26, 2008

(54) PLASMA ETCHING METHOD AND APPARATUS, CONTROL PROGRAM FOR PERFORMING THE ETCHING METHOD, AND STORAGE MEDIUM STORING THE CONTROL PROGRAM

(75) Inventors: Jin Fujihara, Yamanashi (JP); Katsumi Horiguchi, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/354,042

(22) Filed: Feb. 15, 2006

(65) Prior Publication Data
US 2006/0180571 A1 Aug. 17, 2006

Related U.S. Application Data

(60) Provisional application No. 60/658,159, filed on Mar. 4, 2005.

(30) Foreign Application Priority Data
Feb. 16, 2005 (JP) ............... 2005-038647

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |

(52) U.S. Cl. ............... 216/67; 216/41; 438/710
(58) Field of Classification Search ............ 216/67, 216/41; 438/710; 156/345.35
See application file for complete search history.

(56) References Cited

U.S. PATENT DOCUMENTS

| 2001/0006245 A1* | 7/2001 | Yunogami et al. ............ 257/513 |
| 2004/0035826 A1* | 2/2004 | Adachi et al. ................. 216/67 |
| 2005/0079724 A1* | 4/2005 | Ho et al. ..................... 438/710 |

FOREIGN PATENT DOCUMENTS

JP          04215432 A   *   8/1992

\* cited by examiner

*Primary Examiner*—Duy-Vu Deo
*Assistant Examiner*—Mahmoud Dahimene
(74) *Attorney, Agent, or Firm*—Oblon, Spivak, McClelland, Maier & Neustadt, P.C.

(57) ABSTRACT

A plasma etching method for etching an etching target layer of a silicon layer through a mask of a silicon oxide film includes the following sequential steps of forming an opening in the silicon oxide film, wherein an opening dimension of a portion between a top and a bottom surface of the mask is enlarged compared to opening dimensions of the top and the bottom surface of the mask and etching the silicon layer by using a halogen containing gas. A gaseous mixture containing HBr gas, $NF_3$ gas and $O_2$ gas is used as the halogen containing gas. A hole or a trench having an opening diameter or an opening width equal to or smaller than 0.2 μm is formed in the etching target layer. Further, a hole or a trench having an aspect ratio equal to or greater than forty is formed in the etching target layer.

10 Claims, 4 Drawing Sheets

PLASMA ETCHING METHOD AND APPARATUS, CONTROL PROGRAM FOR PERFORMING THE ETCHING METHOD, AND STORAGE MEDIUM STORING THE CONTROL PROGRAM

CROSS-REFERENCE TO RELATED APPLICATIONS

This document claims priority to Japanese Patent Application Number 2005-38647, filed Feb. 16, 2005 and U.S. Provisional Application No. 60/658,159, filed Mar. 4, 2005, the entire content of which are hereby incorporated by reference.

FIELD OF THE INVENTION

The present invention relates to etching apparatus and method capable of forming a hole or a trench having a high aspect ratio, a control program for performing the etching method and a storage medium storing the control program.

BACKGROUND OF THE INVENTION

Recently, along with the trend for high density and high integration of a semiconductor device, its wiring structure becomes finer rapidly. In forming a fine wiring structure, it is important to form a hole or a trench having a high aspect ratio and a small opening dimension.

Figure 4A:
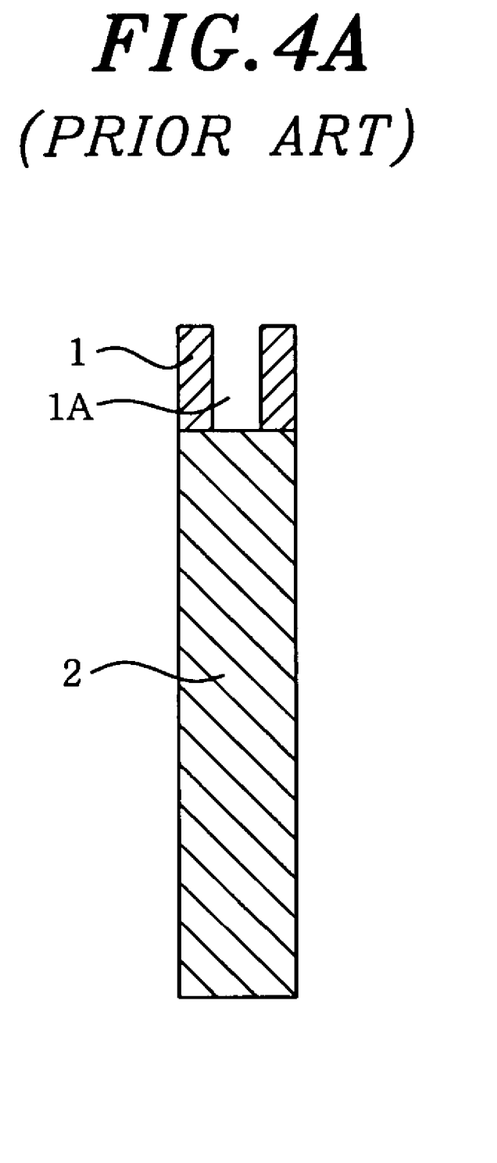
FIGS. 4A and 4B show respective steps of a conventional etching method.
Figure 4B:
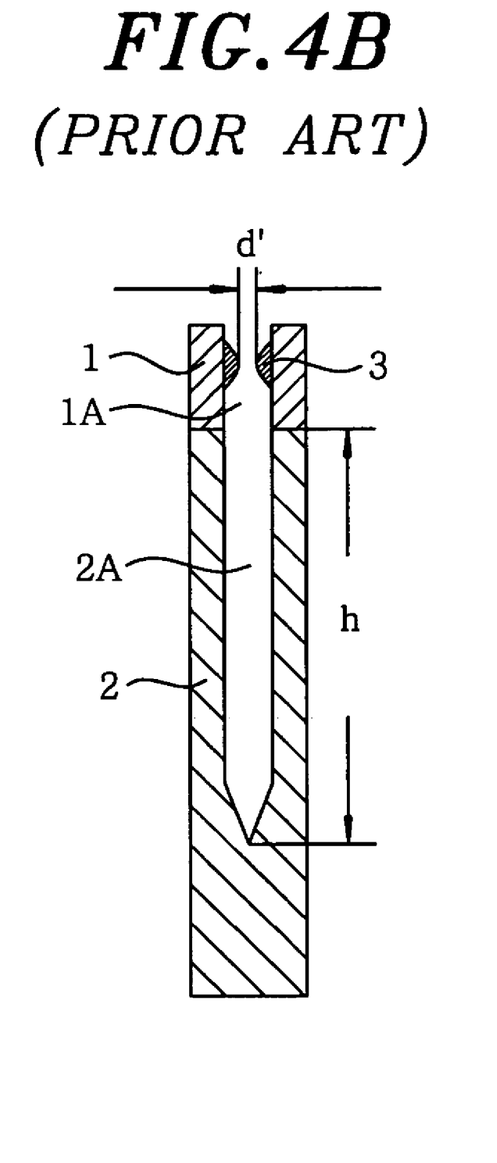

Various plasma etching methods have been proposed for forming a hole or a trench in, e.g., a silicon layer (Si layer). As for a plasma etching method, for example, as shown in FIG. 4A, while a silicon oxide film ($SiO_2$ film) 1 having an opening 1A of a predetermined pattern is employed as a hard mask, the silicon layer (Si layer) 2 which is disposed underneath the $SiO_2$ film 1 is etched in accordance with the opening 1A, whereby a hole or a trench 2A is formed as depicted in FIG. 4B. However, reaction products (e.g., SiBrxOy) generated in etching tend to be attached to the opening 1A of a mask, thereby forming deposits 3 as shown in FIG. 4B.

The deposits 3 formed of reaction products in the opening 1A of the mask tend to grow bigger as the hole or the trench becomes deeper to form more deposits 3 in the opening 1A, thereby making the opening 1A narrower as shown in FIG. 4B. As a result, an effective actual opening dimension d' of the opening 1A becomes smaller and an apparent aspect ratio h/d' increases. Thus, an etching rate in the hole or the trench 2A becomes low and a very long time is required for etching the hole or the trench of a desired depth. As the hole or the trench 2A gets deeper and the etching rate becomes slower, a sidewall of the hole or the trench 2A tapers away and, occasionally, an etching may be stopped altogether.

Therefore, the applicant of the present invention proposed a technology for preventing reaction products from being attached to the opening of the mask (see, e.g., Reference 1). This technology employs as an etching gas a processing gas containing a gaseous mixture in which one or both of $SF_6$ gas and $NF_3$ gas are added to HBr gas, $O_2$ gas and $SiF_4$ gas, wherein a gas containing C and F is further added to the processing gas. By controlling the timing of adding the gas containing C and F (e.g., $CF_4$ gas) to the etching gas, the accumulation of deposits at the opening of the mask can be suppressed and a hole or a trench having a high aspect ratio can be achieved.

Further, Reference 2 discloses an etching method capable of enhancing an etching anisotropy. In this case, when the semiconductor substrate is etched through a mask which is formed on the semiconductor substrate and has a lid shaped section, etching particles obliquely incident upon the opening of the mask are introduced into the lid, whereby the etching particles can be prevented from being scattered on the sidewall of the trench, thereby realizing an anisotropic etching.

[Reference 1] Japanese Patent Laid-open Application No. 2004-304029

[Reference 2] Japanese Patent Laid-open Application No. H1-216536

However, in the technology disclosed in Reference 1, since the deposits are prevented from being formed in the opening of the hard mask by a gas containing C and F which is added to the processing gas, the gas containing C and F for preventing the deposits is necessary in addition to the main etching gas. Further, since a hard mask itself is reduced by the gas containing C and F, an added amount of the gas containing C and F and a timing of adding it should be controlled. That is, when forming the hole or the trench having a high aspect ratio and an opening dimension equal to or smaller than 0.2 μm, the deposits in the opening of the mask have to be removed or prevented from growing during the etching.

Further, Reference 2 discloses a technology for preventing etching particles from scattering by using a lid of a mask, but it does not mention an attachment of the reaction products or an undesirable effect caused thereby.

SUMMARY OF THE INVENTION

The present invention has been developed to solve the above drawbacks of the conventional technologies; and it is, therefore, an object of the present invention to provide an etching apparatus and method capable of forming a hole or a trench having a favorable shape wherein an etching rate is not reduced even while etching reaction products are attached to an opening of a mask, a control program for performing the etching method and a storage medium storing the control program.

In accordance with the present invention, there is provided a plasma etching method for etching an etching target layer through a mask including an opening, wherein an opening dimension of a portion between a top and a bottom surface of the mask is enlarged compared to opening dimensions of the top and the bottom surface of the mask.

Further, preferably, the mask and the etching target layer are respectively a silicon oxide film and a silicon layer, and the opening is formed by using a gas containing a fluorocarbon gas.

In accordance with the present invention, there is provided a plasma etching method for etching an etching target layer of a silicon layer through a mask of a silicon oxide film, including the steps of forming an opening in the silicon oxide film, wherein an opening dimension of a portion between a top and a bottom surface of the mask is enlarged compared to opening dimensions of the top and the bottom surface of the mask, and etching the silicon layer by using a halogen containing gas after the opening is formed.

Further, preferably, a gaseous mixture containing an HBr gas, an $NF_3$ gas and an $O_2$ gas is used as the halogen containing gas.

Furthermore, preferably, a hole or a trench having an opening diameter or an opening width equal to or smaller than 0.2 μm is formed in the etching target layer.

Moreover, preferably, a hole or a trench having an aspect ratio equal to or greater than forty is formed in the etching target layer.

In accordance with the present invention, there is provided a control program executable on a computer for controlling a plasma processing apparatus to perform the plasma etching method.

In accordance with the present invention, there is provided a storage medium for storing therein a control program executable on a computer, wherein the control program is executed to control a plasma processing apparatus for performing the plasma etching method.

In accordance with the present invention, there is provided a processing apparatus including at least two etching apparatuses, and a controller for controlling the etching apparatuses to perform the plasma etching method, wherein each etching apparatus includes an evacuatable processing chamber; an electrode, disposed in the processing chamber, also serving as a mounting table for mounting thereon an object to be processed; a high frequency power supply for applying a high frequency power to the electrode; and a gas supply unit for supplying an etching gas into the processing chamber.

In accordance with the present invention, an etching apparatus and method capable of forming a hole or a trench having a favorable shape wherein the etching rate is not reduced even while etching reaction products are attached to an opening of a mask, a control program for performing the etching method and a storage medium storing the control program.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
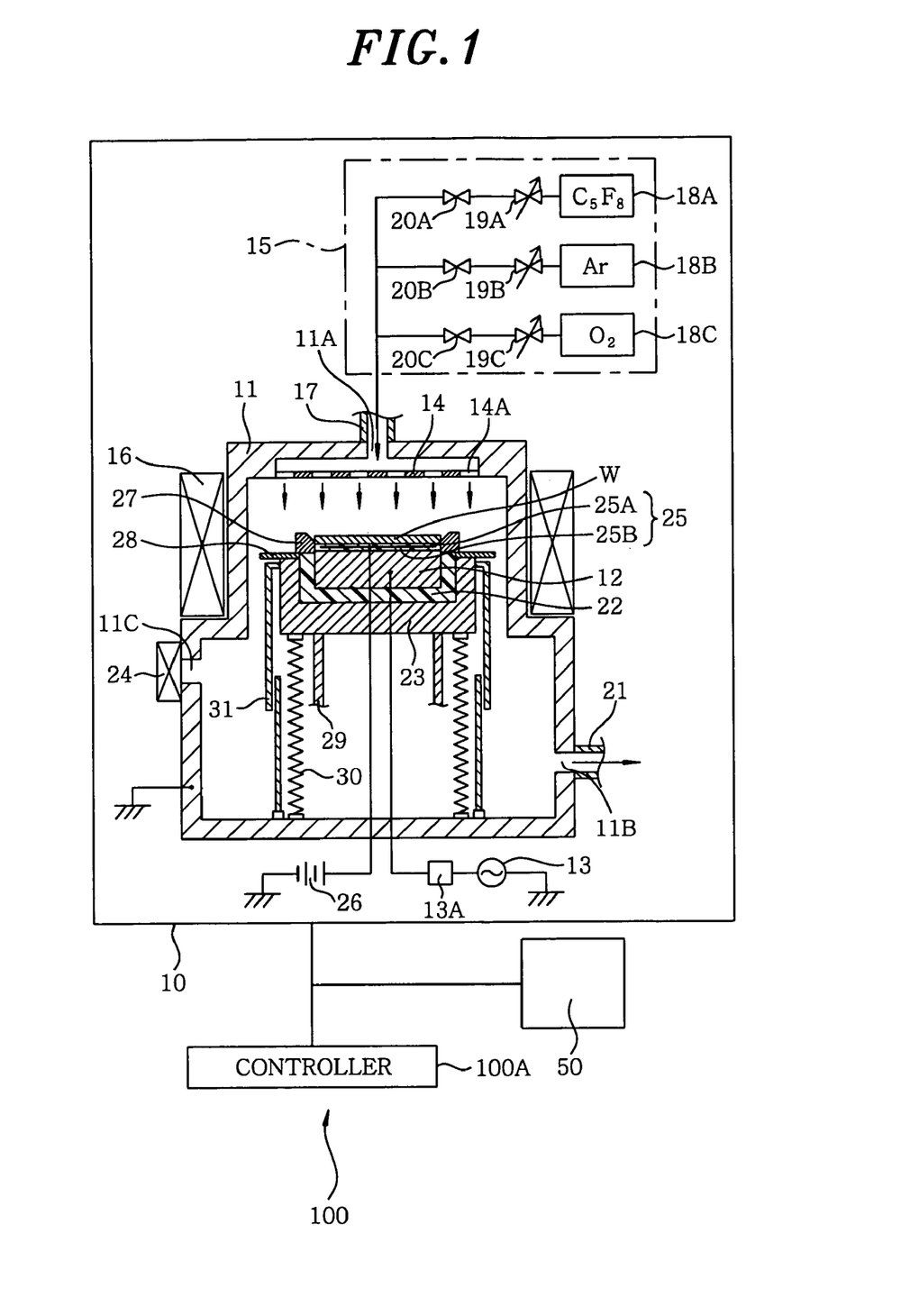
FIG. 1 schematically depicts a cross sectional view showing principal parts of a processing apparatus, especially a first etching apparatus, in accordance with a preferred embodiment of the present invention.

Hereinafter, a preferred embodiment of the present invention will now be described with reference to accompanying drawings. The etching method in accordance with the present invention can be properly performed by a multi chamber type processing apparatus 100, as shown in FIG. 1, wherein a first etching apparatus 10 and a second etching apparatus 50 are coupled to each other. The processing apparatus 100 includes a controller 100A provided with a storage medium storing a control program for controlling the first and the second etching apparatus 10 and 50. The controller 100A controls the first and the second etching apparatus 10 and 50 based on the control program stored in the storage medium. In the first etching apparatus 10, an opening 201A is formed in a silicon oxide film (SiO$_2$ film) 201 which is formed for serving as a hard mask on a surface of an object to be processed (e.g., a wafer) W; and, then, in the second etching apparatus 50, a hole or a trench 202A is formed in a silicon layer (Si layer) 202 disposed underneath the SiO$_2$ film 201 (see FIGS. 3A to 3D). A resist film 203, which has an opening 203A formed after a same pattern as that of the hole or trench 202A, is formed in advance on the surface of the SiO$_2$ film 201 of the wafer W (see FIG. 3A). Further, the SiO$_2$ film 201 is formed by using a CVD film forming method and the opening pattern is formed by a lithography.

First, there will be described the first etching apparatus 10 for forming the opening 201A in the SiO$_2$ film 201. As illustrated in FIG. 1, the etching apparatus 10 includes an evacuatable processing chamber 11 made of aluminum whose surface is alumite treated; a lower electrode 12, disposed in the processing chamber 11, also serving as a mounting table for mounting the wafer W thereon; a high frequency power supply 13, connected to the lower electrode 12, for applying a high frequency power thereto; an upper electrode 14, installed above the lower electrode 12, having a plurality of injection holes 14A for discharging an etching gas; and a gas supply unit 15, connected to the upper electrode 14, for feeding the etching gas thereto. The etching gas in the processing chamber 11 is converted into a plasma by the high frequency power applied to the lower electrode 12 from the high frequency power supply 13 via a matching unit 13A, thereby etching the wafer W. Further, a magnet 16 for applying a magnetic field into the processing chamber 11 is disposed to surround an upper portion of the processing chamber 11, and a plasma density can be enhanced by the magnetic field formed by the magnet 16.

A gas inlet port 11A is formed on a ceiling of the processing chamber 11 to communicate with an inside of the upper electrode 14. The gas inlet port 11A is connected to the gas supply unit 15 via a gas supply line 17. The gas supply unit 15 includes gas supply sources 18A, 18B and 18C, respectively, connected to three branch lines which the gas supply line 17 is divided into. Flow rate control valves 19A, 19B and 19C and opening/closing valves 20A, 20B and 20C are serially provided in respective branch lines from an upstream side to a downstream side. A gaseous mixture containing a C$_5$F$_8$ gas fed from the gas supply source 18A, an Ar gas fed from the gas supply source 18B and an O$_2$ gas fed from the gas supply source 18C is supplied into the upper electrode 14 through the gas supply line 17 to serve as the etching gas. Further, a gas exhaust port 11B is formed at a lower portion of the processing chamber 11 and a vacuum exhaust unit (not shown) is connected to the gas exhaust port 11B via a gas exhaust line 21.

In FIG. 1, the gaseous mixture containing a C$_5$F$_8$ gas, an Ar gas and an O$_2$ gas is exemplified as the etching gas. But, for example, any gas containing fluorocarbon may be satisfactorily used as an etching gas. By using the gas containing fluorocarbon, an isotropic etching can be performed on the SiO$_2$ film 201. Thus, it is possible to form the opening 201A having a so-called bowing shape, wherein it has a curved shape having a larger opening dimension at a vertically central portion. By forming the bowing shaped opening 201A in the SiO$_2$ film 201, when the hole or trench 202A is formed in the Si layer 202 in the second etching apparatus 50, though etching reaction products are attached to the opening 201A, the hole or trench 202A having a vertical sidewall can be formed without reducing an etching rate in a deep part of the hole or trench 202A. Especially, the bowing shaped opening 201A serves effectively in case of forming a hole having an opening diameter equal to or smaller than 0.2 μm or a trench 202A having an opening width equal to or smaller than 0.2 μm.

As shown in FIG. 1, the lower electrode 12 is formed of, e.g., aluminum and supported by a conductive supporter 23 via an insulator 22. The wafer W is loaded onto or unloaded from lower electrode 12 through a gate 11C disposed in a lower portion of the processing chamber 11. The gate 11C is opened or closed by a gate valve 24 attached thereto. An electrostatic chuck 25 is disposed on a top surface of the lower electrode 12. The electrostatic chuck 25 includes an electrode 25A formed of a conductive material such as copper and a polyimide resin 25B having the electrode 25A therein. A high voltage DC power supply 26 is connected to the electrostatic chuck 25, and the wafer W is electrostatically adsorbed onto the electrostatic chuck 25 by a high DC voltage applied to the electrostatic chuck 25 from the high voltage DC power supply 26. Further, a coolant path (not shown) is formed inside the lower electrode 12, and the wafer W can be controlled to be kept at a specified temperature by circulating a coolant therethrough. A focus ring 27 is disposed in an outer peripheral portion on the lower electrode 12 and a baffle plate 28 is provided outside the focus ring 27. The lower electrode 12 and the supporter 23 can be elevated by a ball screw mechanism including a ball screw 29. A driving section under the supporter 23 is covered with a bellows 30 made of stainless steel, and a bellows cover 31 is provided outside the bellows 30. The supporter 23 is electrically connected to the processing chamber 11 via the bellows 30 to be grounded.

Figure 2:
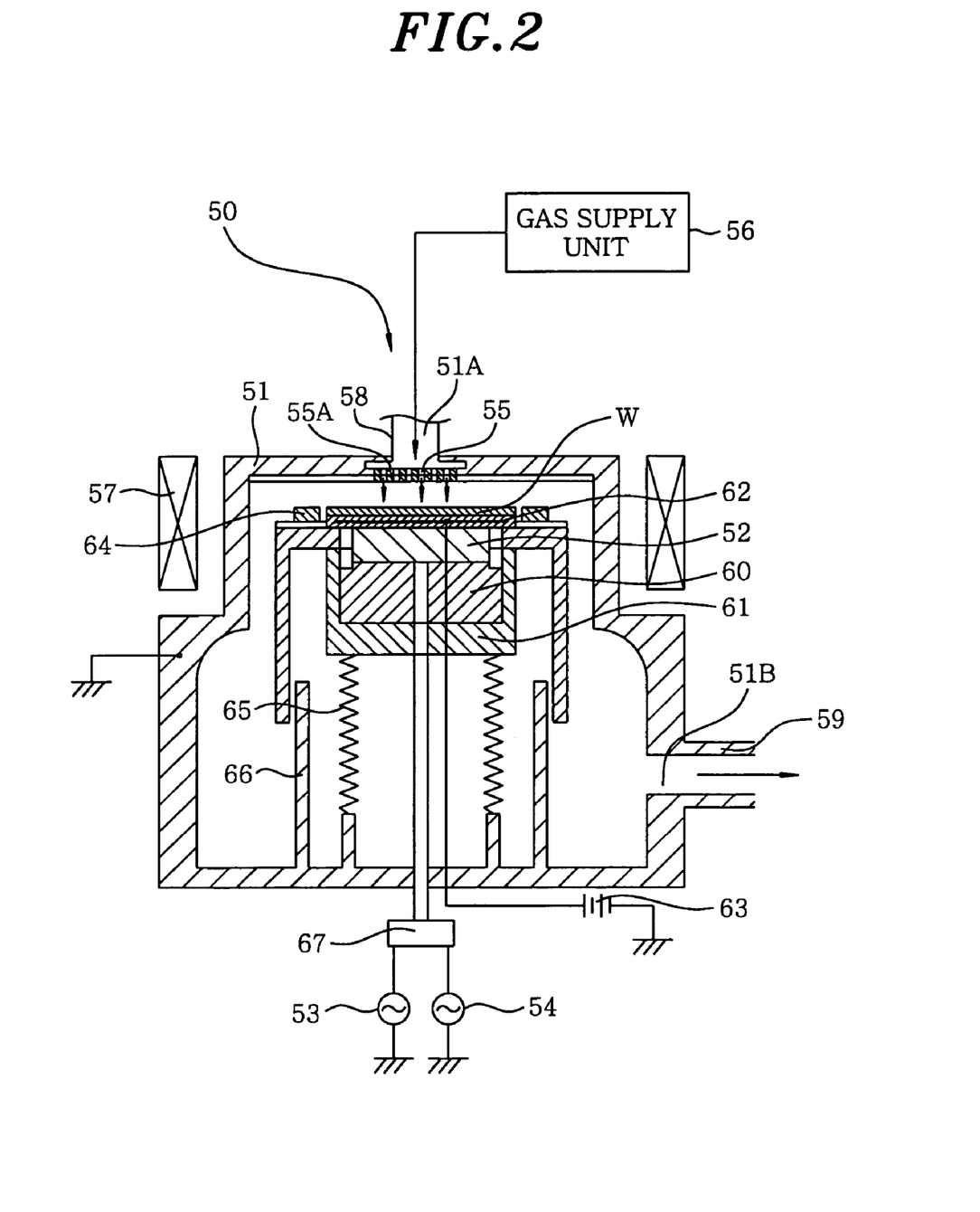
FIG. 2 illustrates a vertical sectional view showing a second etching apparatus in the processing apparatus shown in FIG. 1.

Hereinafter, there will be described the second etching apparatus 50 in which the hole or trench 202A is formed in the Si layer 202 through a hard mask of the $SiO_2$ film 201. The second etching apparatus 50 is configured to obtain a high plasma density by employing a higher pressure range than that used in the first etching apparatus 10.

The second etching apparatus 50 includes, for example, as depicted in FIG. 2, an evacuatable processing chamber 51 made of aluminum whose surface is alumite treated; a lower electrode 52, disposed in the processing chamber 51 to be vertically movable, also serving as a mounting table for mounting the wafer W thereon; a first and a second high frequency power supply 53 and 54, connected to the lower electrode 52, for respectively applying a first and a second high frequency power having different frequencies thereto; an upper electrode 55, installed above the lower electrode 52, having a plurality of injection holes 55A for discharging an etching gas; and a gas supply unit 56, connected to the upper electrode 55, for feeding the etching gas thereto. The etching gas in the processing chamber 51 is converted into a plasma by the first and the second high frequency power, having different frequencies, independently applied to the lower electrode 52 from the first and the second high frequency power supply 53 and 54, whereby the wafer W is etched. Further, a magnet 57 for forming a magnetic field in the processing chamber 51 is disposed around an upper portion of the processing chamber 51, whereby a plasma density can be enhanced by the magnetic field formed by the magnet 57.

A gas inlet port 51A is formed on a ceiling of the processing chamber 51 to communicate with an inside of the upper electrode 55. The gas inlet port 51A is connected to the gas supply unit 56 via a gas supply line 58. The gas supply unit 56 includes plural gas supply sources (not shown), and plural kinds of gases therefrom are mixed to be supplied as an etching gas. Further, a gas exhaust port 51B is formed at a lower portion of the processing chamber 51 and a vacuum exhaust unit (not shown) is connected to the gas exhaust port 51B via a gas exhaust line 59.

As for an etching gas, a gaseous mixture obtained by mingling a halogen containing gas with an $O_2$ gas is preferable. The halogen containing gas may be, for example, an HBr gas, an $NF_3$ gas, an $SF_6$ gas and an $SiF_4$ gas. These gases can be used together with an $O_2$ gas by a proper combination, for example, as presented in Table 1.

TABLE 1

|   | HBr | $NF_3$ | $SF_6$ | $O_2$ | $SiF_4$ |
|---|-----|--------|--------|-------|---------|
| 1 | O   | O      | O      | O     | O       |
| 2 | O   | O      |        | O     | O       |
| 3 | O   | O      |        |       |         |
| 4 | O   |        |        | O     | O       |
| 5 | O   |        | O      | O     | O       |

As shown in FIG. 2, an insulator 60 and a conductor 61 are disposed under the lower electrode 52, and the lower electrode 52, the insulator 60 and the conductor 61 are vertically movable by an elevation mechanism (not shown). An electrostatic chuck 62 on which the wafer is mounted is disposed on a top surface of the lower electrode 52 and a high voltage DC power supply 63 is connected to the electrostatic chuck 62. A focus ring 64 is disposed to surround an outer periphery of the electrostatic chuck 62. Further, the conductor 61 is electrically connected to a bottom portion of the processing chamber 51 via the bellows 65 made of stainless steel, thereby being grounded. A gas channel (not shown) is formed in the lower electrode 52 and the electrostatic chuck 62 such that it is open to a plurality of spots of a central and a peripheral portion of the wafer W to thereby supply a He gas to a bottom surface of the wafer W. Further, the bellows 65 is isolated from the other space inside the processing chamber 51 by a bellow cover 66. Besides, a reference numeral 67 represents a matching unit.

Next, there will be explained an etching method for forming the hole or trench 202A in the Si layer 202 of the wafer W having a diameter of, e.g., 200 mm by using the above-mentioned processing apparatus 100 in accordance with a preferred embodiment of the present invention. The controller 100A of the processing apparatus 100 controls the first and the second etching apparatus 10 and 50 based on the control program, whereby the wafer W is etched as will be described later.

Figure 3A:
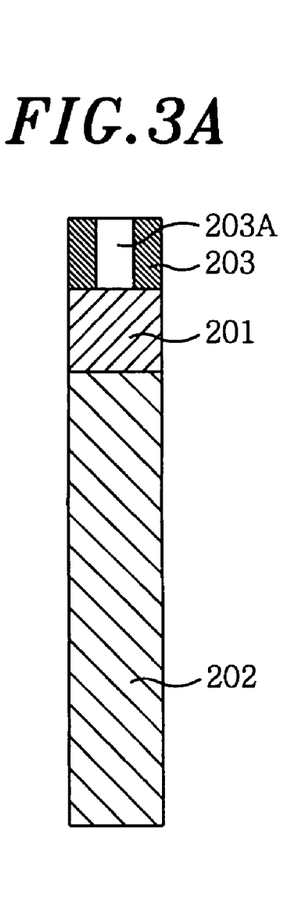
FIGS. 3A to 3D show respective steps of an etching method performed by employing the processing apparatus shown in FIG. 1.

The first etching apparatus 10 is operated under a control of the controller 100A, wherein the opening 201A is formed in the $SiO_2$ film 201 of the wafer W, the $SiO_2$ film 201 serving as a hard mask on the Si layer 202. The wafer W includes, for example, as shown in FIG. 3A, the $SiO_2$ film 201 serving as a hard mask; the Si layer 202, formed under the $SiO_2$ film 201, serving as a layer to be etched; and a resist film 203, formed on the $SiO_2$ film 201, serving as a mask. The opening 203A is formed in advance in the resist film 203 in accordance with a pattern of the hole or trench 202A of the resist film 203. The opening 203A is formed in a pattern for forming the opening 202A in the Si layer 202.

First, when the wafer W is loaded into the processing chamber 11 through the gate 11C to be mounted on the lower electrode 12 in the first etching apparatus 10, the wafer W is electrostatically adsorbed onto the electrostatic chuck 25. After the gate 11C is closed by the gate valve 24, a gaseous mixture of $C_5F_8$ gas, Ar gas and $O_2$ gas fed respectively from the gas supply sources 18A, 18B and 18C of the gas supply unit 15 is supplied onto the wafer W through the injection holes 14A of the upper electrode 14 to serve as an etching gas while its flow rate ratio is controlled at a specified value by respective flow rate control valves 19A, 19B and 19C. Preferably, flow rate ranges of $C_5F_8$ gas, Ar gas and $O_2$ gas are, respectively, for example, 5~30 sccm, 50~1000 sccm and 1~20 sccm. A gas pressure in the processing chamber 11 is preferable to range from 15 to 100 mTorr, for example. Even while the etching gas is introduced, the He gas whose flow rate is controlled is supplied to the bottom surface of the wafer W to cool the wafer W. A Pressure of He gas reaching the bottom surface of the wafer W is preferable to range from 5 to 30 Torr in its central portion and range from 10 to 50 Torr in its peripheral portion. Preferably, for example, the temperature of the lower electrode 12 ranges from −20 to 60° C.; the temperature of the sidewall of the processing chamber 11 ranges from 50 to 100° C.; and the temperature of the upper electrode 14 ranges from 50 to 100° C.

When the processing chamber 11 has a specified vacuum level therein, a high frequency power is applied from the high frequency power supply 13 to generate a plasma of the etching gas between the lower electrode 12 and the upper electrode 14. The high frequency power, preferably, ranges from 1000 W to 2500 W. Further, if necessary, a magnetic field can be formed in the processing chamber 11 by the magnet 16. An intensity of the magnetic field preferably is in a range of 50~300 gauss.

Figure 3B:
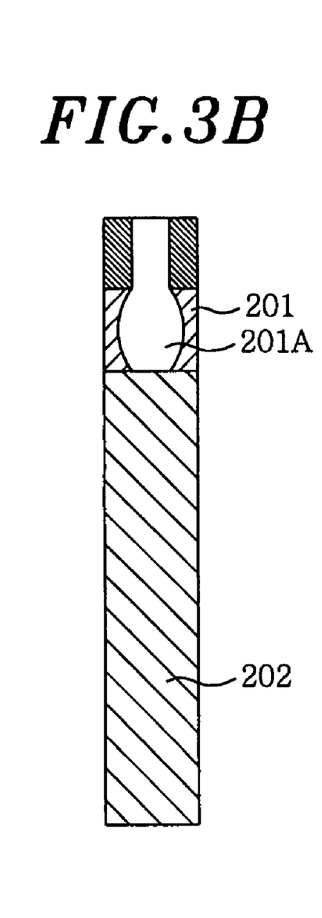

When the $SiO_2$ film 201 is etched through a mask of the resist film 203 under the aforementioned condition, an isotropic etching is performed on the $SiO_2$ film 201 shown in FIG. 3A and the opening 201A having a sidewall of a bowing shape is formed as shown in FIG. 3B.

Figure 3C:
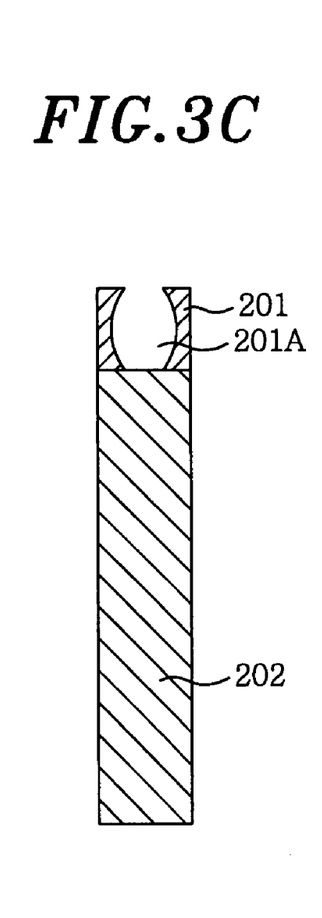

After the opening 201A having a bowing shape is formed in the $SiO_2$ film 201 in the first etching apparatus 10, the wafer W is unloaded from the first etching apparatus 10 and the resist film 203 is removed by an ashing apparatus (not shown) of the processing apparatus 100 (see FIG. 3C). Then, the wafer W is loaded into the processing chamber 51 of the second etching apparatus 50 and electrostatically adsorbed on the electrostatic chuck 62 disposed on the lower electrode 52.

Thereafter, a gaseous mixture of, e.g., HBr gas, $NF_3$ gas, $SiF_4$ gas and $O_2$ gas fed from the gas supply unit 56 is supplied into the upper electrode 55 while its flow rate ratio is controlled to be set at a specified value and, then, the gaseous mixture is supplied onto the wafer W through the injection holes 55A of the upper electrode 55 to serve as an etching gas. Preferably, flow rates of HBr gas, $NF_3$ gas, $SiF_4$ gas and $O_2$ gas range, respectively, for example, 150~350 sccm, 10~50 sccm, 0~20 sccm and 10~50 sccm. A gas pressure in the processing chamber 51 is preferable to range from 100 to 300 mTorr, for example. Meanwhile, the He gas whose flow rate is controlled is supplied from a He gas supply source to the bottom surface of the wafer W to cool the wafer W. A Pressure of He gas reaching the bottom surface of the wafer W is preferable to range from 5 to 30 Torr in its central portion and range from 10 to 50 Torr in its peripheral portion. Further, preferably, the temperature of the lower electrode 52 ranges from 50 to 120° C.; the temperature of the sidewall of the processing chamber 51 ranges from 50 to 100° C.; and the temperature of the upper electrode 55 ranges from 50 to 100° C.

When the processing chamber 51 has a specified vacuum level therein, the first and the second high frequency power are applied to the lower electrode 52 from the first and the second high frequency power supply 53 and 54, respectively, to generate a plasma of the etching gas between the lower electrode 52 and the upper electrode 55. At this time, the first high frequency power is set to have a higher frequency than that of the second high frequency power. Since the first and the second high frequency power are independently controlled, a so-called bowing phenomenon, wherein the sidewall of the hole or trench 202A formed in the Si layer 202 is cut into a curved surface, is prevented, thereby forming a vertical sidewall of the hole or trench 202A. The first high frequency power is preferably set to have a frequency equal to or higher than 27.12 MHz and, particularly, when no magnetic field is formed.

As occasion demands, the magnetic field is formed in the processing chamber 51 to form a high density plasma. When the magnetic field is formed, the first high frequency power is set to have a frequency of 13.56 MHz. In this case, even though the frequency of first high frequency power is lower than 27.12 MHz, a high density plasma can be formed by the magnetic field. The second high frequency power is preferably set to have a frequency of, e.g., 3.2 MHz. Further, it is preferable that both the first and the second high frequency power range from 500 to 1000 W. When the magnetic field is formed, its intensity preferably has a range of 50~300 gauss.

Figure 3D:
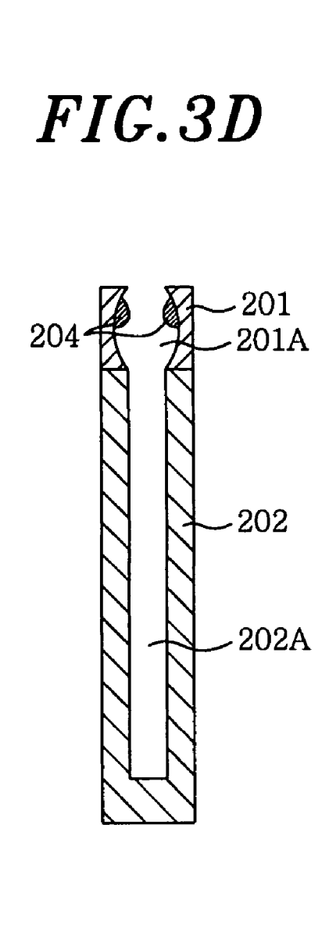

When the Si layer 202 is etched through a mask of the $SiO_2$ film 201 under the aforementioned processing condition, as shown in FIG. 3D, reaction products are attached to the bowing shaped sidewall of the $SiO_2$ film 201 to form deposits 204. Since the opening 201A has a bowing shape in this embodiment, only the larger diameter portion of the sidewall is filled with the deposits 204, and the opening 201A does not become narrow or small. Accordingly, an apparent aspect ratio does not increase due to the deposits 204 and it can be prevented or suppressed that an etching rate is reduced as the hole or trench 202A becomes deeper. As a result, the bottom portion and the sidewall of the hole or trench 202A are etched at the same rate until it becomes deep enough, and a tapering of the sidewall is prevented or suppressed. Further, the above-mentioned processing condition is related to a wafer having a diameter of 200 mm. If a wafer size is changed, a processing condition suitable for the wafer size should be set again in the processing apparatus 100.

As described above, in accordance with the preferred embodiment of the present invention, since the Si layer 202 is etched through a hard mask of the $SiO_2$ film 201 including the opening 201A having a bowing shaped sidewall, though the reaction products are attached to the sidewall in etching, the opening 201A does not become narrow or small due the deposits 204 and the etching rate is not reduced. Accordingly, since the etching can be stably performed until the hole or trench 202A has a desired depth, the hole or trench 202A having a high aspect ratio can be formed and the sidewall can be prevented from being tapered. Further, in accordance with the preferred embodiment, when the Si layer 202 is etched through a hard mask of the $SiO_2$ film 201, since the opening 201A is formed in the $SiO_2$ film 201 by using a gas containing $C_5F_8$ gas, the bowing shaped opening 201A can be definitely formed in the $SiO_2$ film 201 by an isotropic etching.

Further, in accordance with the preferred embodiment, since the Si layer 202 is etched by using a halogen containing gas (e.g., HBr gas, $NF_3$ gas, $SF_6$ gas and $SiF_4$ gas) after the bowing shaped opening 201A is formed in the $SiO_2$ film 201, a protection film is formed in the sidewall of the hole or trench 202A formed in the Si layer 202, whereby the sidewall is formed vertically. Particularly, by employing a gas containing HBr gas, $NF_3$ gas and $O_2$ gas for the halogen containing gas, the vertical sidewall can be further ensured to be formed.

Further, in accordance with the preferred embodiment, even when a hole having an opening diameter equal to or smaller than 0.2 μm or a trench having an opening width equal to or smaller than 0.2 μm is formed in the Si layer 202, since the opening 201A of the $SiO_2$ film 201 has a bowing shape, though the deposits 204 are formed in the opening 201A, the opening 201A is not getting narrower and the hole or trench 202A having a desired high aspect ratio can be securely formed. Besides, even when a hole or trench 202A having an aspect ratio equal to or greater than forty is formed in the Si layer 202, an etching rate is not reduced as the hole or trench 202A becomes deeper and the hole or trench 202A can be reliably formed in a desired shape.

Moreover, in accordance with the preferred embodiment, the controller (computer) 100A controls the first and the second etching apparatus 10 and 50 based on the control program such that, after an opening 201A having a bowing shape is formed in the $SiO_2$ film 201 in the first etching apparatus 10, the Si layer 202 is etched through a hard mask of the $SiO_2$ film 201 in the second etching apparatus 50. Accordingly, the hole or trench 202A having an opening diameter or an opening width equal to or smaller than 0.2 μm and having an aspect ratio equal to or greater than forty can be definitely formed in a desired shape. Further, in accordance with the preferred embodiment, a storage medium storing a control program is installed in the controller 100A and the controller 100A is operated based on the control program to control the first and the second etching apparatus 10 and 50. After an opening 201A having a bowing shape is formed in the $SiO_2$ film 201 in the first etching apparatus 10, the Si layer 202 is etched through a hard mask of the $SiO_2$ film 201 in the second etching apparatus 50. Accordingly, the hole or trench 202A having an opening diameter or an opening width equal to or smaller than 0.2 μm and having an aspect ratio equal to or greater than forty can be formed in a desired shape.

Hereinafter, a specific embodiment will be described.

EMBODIMENT 1

In Embodiment 1, an etching was performed on a wafer having a diameter of 200 mm under the following conditions presented in Tables 2 and 3 by using the above-mentioned processing apparatus, wherein the wafer had thereon a resist film with an opening of 0.16 μm, thereby forming a trench in a Si layer. At this time, the wafer was etched for 3 minutes in the first etching apparatus to form a bowing shaped opening in a $SiO_2$ film and, then, the wafer was etched for 13.5 minutes through a hard mask of the $SiO_2$ film having the bowing shaped opening in the second etching apparatus to form a trench in the Si layer. Subsequently, a sectional view of the processed wafer was observed to measure an opening width CD of the bowing shaped opening and an aspect ratio of the trench formed in the Si layer. Table 4 shows the measurement results. Further, the wafer in Embodiment 1 corresponds to a bowing mask in Table 4.

COMPARISON EXAMPLE

Besides, in Comparison example, a Si layer was etched through a hard mask of the $SiO_2$ film having an opening which had a vertical sidewall and the same opening width as that of the opening in Embodiment 1 under the etching condition presented in Table 3. Then, in the same way as in Embodiment 1, a sectional view of the wafer was observed to measure an opening width CD of the opening having the vertical sidewall and an aspect ratio of the trench formed in the Si layer. Table 4 shows the measurement results. Further, the wafer in Comparison example corresponds to a vertical mask in Table 4.

TABLE 2

| | Pressure | 25 mT |
|---|---|---|
| | High frequency power | 1800 W |
| | $C_5F_8$ | 16 sccm |
| | Ar | 300 sccm |
| | $O_2$ | 16 sccm |
| Temperature | Upper electrode | 60° C. |
| | Sidewall | 60° C. |
| | Lower electrode | 20° C. |
| Pressure of | Center | 7 Torr |
| He gas | Edge | 40 Torr |

TABLE 3

| | Pressure | 215 mT |
|---|---|---|
| Power | First high frequency power | 800 W |
| | Second high frequency power | 800 W |
| | HBr | 200 sccm |
| | $NF_3$ | 25 sccm |
| | $SiF_4$ | 3 sccm |
| | $O_2$ | 16 sccm |
| Pressure of | Center | 15 Torr |
| He gas | Edge | 20 Torr |

TABLE 4

| | Opening CD [nm] | Aspect ratio |
|---|---|---|
| Bowing mask | 97 | 53.7 |
| Vertical mask | 78 | 46.6 |

According to the results shown Table 4, the bowing mask of Embodiment 1 has a larger opening width compared to the vertical mask, the opening is not getting narrower due to deposits. As a result, the bowing mask of Embodiment 1 can realize the formation of a trench having an aspect ratio at least 15% higher compared to the vertical mask.

Further, the present invention is not limited to the aforementioned preferred embodiment. In the preferred embodiment, a silicon semiconductor, wherein the Si layer is etched through a mask of the $SiO_2$ film, has been exemplified, but the mask and the layer to be etched of the present invention can be applied to a compound semiconductor in addition to the silicon semiconductor. Thus, a gas having a composition suitable for the layer to be etched can be adequately used as an etching gas. Further, an etching apparatus is not limited to the one used in the above-mentioned preferred embodiment. Briefly, the present invention includes an etching method for etching a layer to be etched through a mask having an opening, wherein an opening dimension of a portion between a top and a bottom surface of the mask is enlarged compared to opening dimensions of the top and the bottom surface of the mask, a control program for performing the etching method and a storage medium storing the control program.

While the invention has been shown and described with respect to the preferred embodiments, it will be understood by those skilled in the art that various changes and modification may be made without departing from the spirit and scope of the invention as defined in the following claims.

What is claimed is:

1. A plasma etching method for etching an etching target layer through a mask including an opening, the method comprising:
   performing an isotropic etching on the mask by using a gas containing a fluorocarbon gas such that an opening dimension of a portion between a top and a bottom surface of the mask is enlarged compared to opening dimensions of the top and the bottom surface of the mask, and
   the portion forms a continuous bow from the top surface of the mask to the bottom surface of the mask to form a continuous concave arc from the top surface of the mask to the bottom surface of the mask.

2. The plasma etching method of claim 1, wherein the mask and the etching target layer are respectively a silicon oxide film and a silicon layer.

3. A plasma etching method for etching an etching target layer of a silicon layer through a mask of a silicon oxide film, comprising the steps of:

forming an opening in the silicon oxide film;

performing an isotropic etching on the mask by using a gas containing a fluorocarbon gas such that an opening dimension of a portion between a top and a bottom surface of the mask is enlarged compared to opening dimensions of the top and the bottom surface of the mask, and the portion forms a continuous bow from the top surface of the mask to the bottom surface of the mask to form a continuous concave arc from the top surface of the mask to the bottom surface of the mask; and etching the silicon layer by using a halogen containing gas after the opening is formed.

4. The plasma etching method of claim 3, wherein a gaseous mixture containing an HBr gas, an $NF_3$ gas and an $O_2$ gas is used as the halogen containing gas.

5. The plasma etching method of claim 1, wherein a hole or a trench having an opening diameter or an opening width equal to or smaller than 0.2 μm is formed in the etching target layer.

6. The plasma etching method of claim 1, wherein a hole or a trench having an aspect ratio equal to or greater than forty is formed in the etching target layer.

7. The plasma etching method of claim 3, wherein a hole or a trench having an opening diameter or an opening width equal to or smaller than 0.2 μm is formed in the etching target layer.

8. The plasma etching method of claim 3, wherein a hole or a trench having an aspect ratio equal to or greater than forty is formed in the etching target layer.

9. The plasma etching method of claim 1, wherein the mask is a single layer.

10. The plasma etching method of claim 3, wherein the mask is a single layer.

\* \* \* \* \*